United States Patent
Kim

(10) Patent No.: US 8,264,153 B2
(45) Date of Patent: Sep. 11, 2012

(54) PLASMA SOURCE FOR LARGE SIZE SUBSTRATE

(75) Inventor: Hongseub Kim, Suwon-si (KR)

(73) Assignee: Jehara Corporation, Suwon-si (KR)

( * ) Notice: Subject to any disclaimer, the term of this patent is extended or adjusted under 35 U.S.C. 154(b) by 227 days.

(21) Appl. No.: 12/852,804

(22) Filed: Aug. 9, 2010

(65) Prior Publication Data

US 2012/0032596 A1    Feb. 9, 2012

(51) Int. Cl.
  *H01J 7/24*    (2006.01)
  *H01J 17/26*   (2006.01)
  *H01J 61/28*   (2006.01)
  *H05B 31/26*   (2006.01)

(52) U.S. Cl. .............................. 315/111.21; 313/231.31

(58) Field of Classification Search ............. 315/111.21; 313/231.31, 231.01, 231.71
  See application file for complete search history.

(56) References Cited

U.S. PATENT DOCUMENTS

| 6,310,577 B1 * | 10/2001 | Ra ................................. 343/701 |
| 6,388,382 B1 * | 5/2002 | Doi et al. ................. 315/111.51 |
| 6,462,481 B1 * | 10/2002 | Holland et al. ........... 315/111.21 |
| 6,750,614 B2 * | 6/2004 | Nakano et al. ........... 315/111.21 |
| 6,756,737 B2 * | 6/2004 | Doi et al. ................. 315/111.51 |
| 7,442,273 B2 * | 10/2008 | Kwon et al. ............. 156/345.48 |

FOREIGN PATENT DOCUMENTS

| JP | 10-172792 | 6/1998 |
| JP | 2006-216605 | 8/2006 |
| KR | 10-2005-0007624 | 1/2005 |
| KR | 10-2005-0011349 | 1/2005 |
| KR | 10-2006-0024690 | 3/2006 |
| WO | WO 2008/143405 A1 | 11/2008 |

* cited by examiner

*Primary Examiner* — Shawki Ismail
*Assistant Examiner* — Dylan White
(74) *Attorney, Agent, or Firm* — NSIP Law

(57) ABSTRACT

A plasma source for a substrate is provided. The plasma source may include a source electrode and an impedance box. The source electrode receives a source Radio Frequency (RF) from the external and generates plasma based on capacitive coupling within a vacuum chamber. The impedance box connects at one end to an outer circumference surface of the source electrode, and is grounded at the other end to the vacuum chamber, and controls an electric current flowing from the source electrode to the vacuum chamber by the source RF.

6 Claims, 6 Drawing Sheets

PLASMA SOURCE FOR LARGE SIZE SUBSTRATE

BACKGROUND

1. Technical Field

The following description relates to a plasma source. For example, the following description relates to a plasma source for a substrate, for solving the non-uniformity of a density of plasma caused by the standing wave effect generated according to large sizing of a substrate, by installing a plurality of impedance boxes for current control at an outer circumference surface of a source electrode, which is a plate shape antenna, such that the plurality of impedance boxes are grounded to a vacuum chamber, and making the impedances of the respective impedance boxes separately controllable.

2. Description of the Related Art

In general, plasma, an ionized gas, is the fourth state of matter that is not solid, liquid, and gas. Free electrons, positive ions, neutral atoms, and neutron molecules exist within plasma and incessantly interact with each other. The control of each component and concentration of free electrons, positive ions, neutral atoms, and neutron molecules is of significance. In engineering aspects, plasma is regarded as being in the field of gas, which can be formed and controlled by an external electric field.

A conventional plasma generating apparatus is described below.

As illustrated in FIG. 1, the conventional plasma generating apparatus is constructed to generate plasma 18 based on capacitive coupling within a vacuum chamber 10, by installing two plate electrodes that are a source electrode 11 and an Electrostatic Chuck (ESC) (or a susceptor) 12 spaced a predetermined distance apart up/down within a central region of a substrate 17, then placing the substrate 17 on a top surface of the ESC 12, and then applying a Radio Frequency (RF) to the source electrode 11 and the ESC 12 from the external to form a strong electric field between the source electrode 11 and the ESC 12. Non-described reference numerals 13, 14, 15, and 16 denote a source RF, a bias RF, a source matcher, and a bias matcher, respectively. The thus generated plasma is used for deposition, etching, etc. in a Liquid Crystal Display (LCD) device or solar light device.

In recent years, a substrate is in trend of large sizing. Because of this, an antenna for generating plasma should increase in size. However, according to the conventional art illustrated in FIG. 1, because the plate shape antenna, the source electrode 11, is in floating, a boundary condition is not fixed. Due to this, the non-uniformity of an electric field between a center and edge of the source electrode 11 is generated and thus, as illustrated in FIG. 2, a Radio Frequency (RF) power delivered to the edge of the source electrode 11 decreases. This non-uniformity of the electric field results in the standing wave effect, thus causing a problem of deteriorating the uniformity of plasma generated at the edge of the plate shape antenna 11.

SUMMARY

According to an aspect, an embodiment of the present invention may address at least the problems and/or disadvantages described herein and provide one or more advantages described below. According to another aspect, a plasma source is provided for a large size substrate, for solving the non-uniformity of a density of plasma caused by the standing wave effect generated according to large sizing of a substrate.

According to still another aspect, a plasma source includes a source electrode and an impedance box. The source electrode receives a source Radio Frequency (RF) from the external and generates plasma based on capacitive coupling within a vacuum chamber. The impedance box connects at one end to an outer circumference surface of the source electrode, and is grounded at the other end to the vacuum chamber, and controls an electric current flowing from the source electrode to the vacuum chamber by the source RF.

The source electrode is of a disk shape or rectangular shape.

The impedance box is comprised of a plurality of impedance boxes, and each of the impedances of the plurality of impedance boxes is separately controlled to equally control potential differences among edge portions of the source electrode connecting with the plurality of impedance boxes.

The impedance box is any one of a parallel resonance circuit, a serial resonance circuit, a parallel variable resonance circuit, and a serial variable resonance circuit.

The source electrode is positioned at a top or bottom of the vacuum chamber, or is positioned at all of a top and bottom of the vacuum chamber.

Other features and aspects will be apparent from the following detailed description, the drawings, and the claims.

Figure 1:
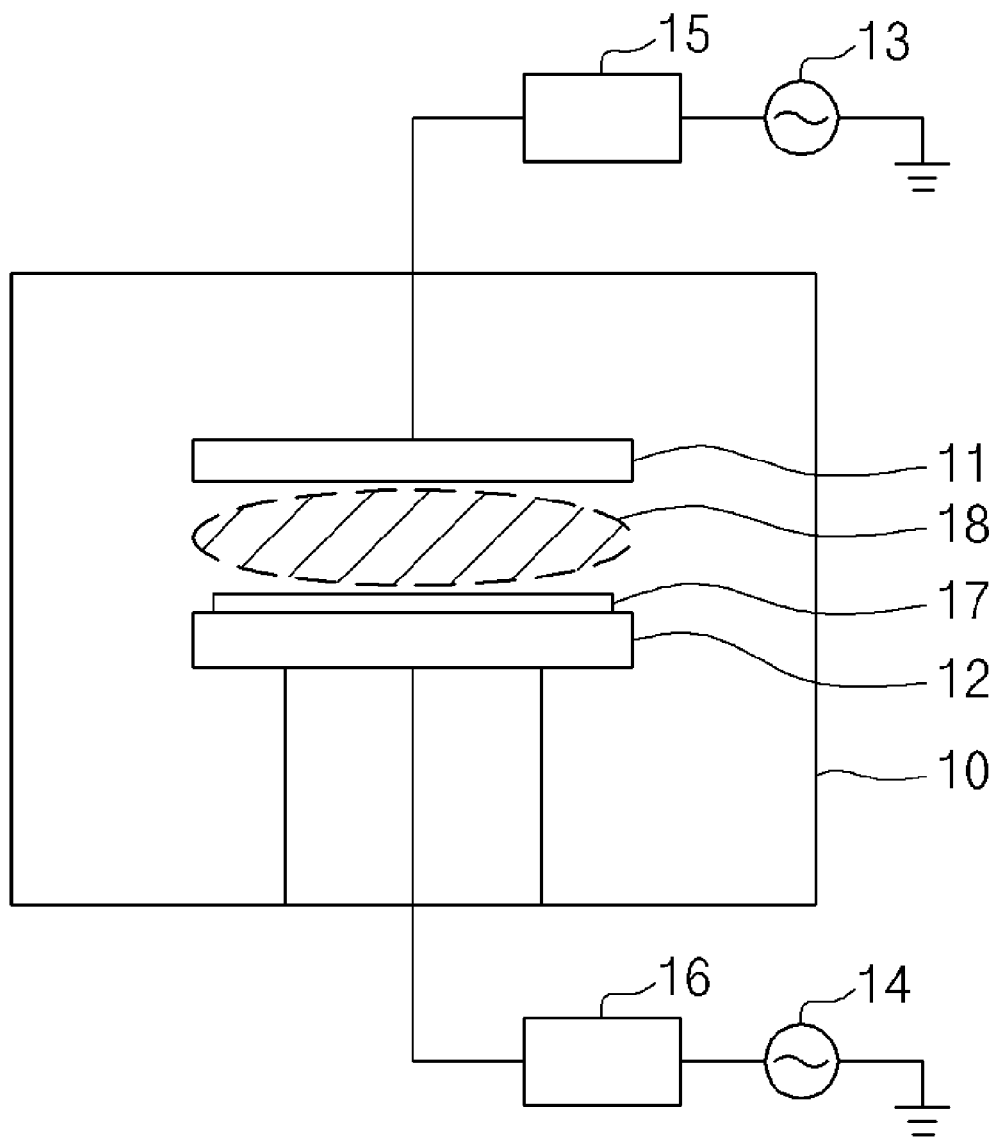
FIG. 1 is a schematic diagram illustrating an example of a plasma generating apparatus according to the conventional art.
Figure 2:
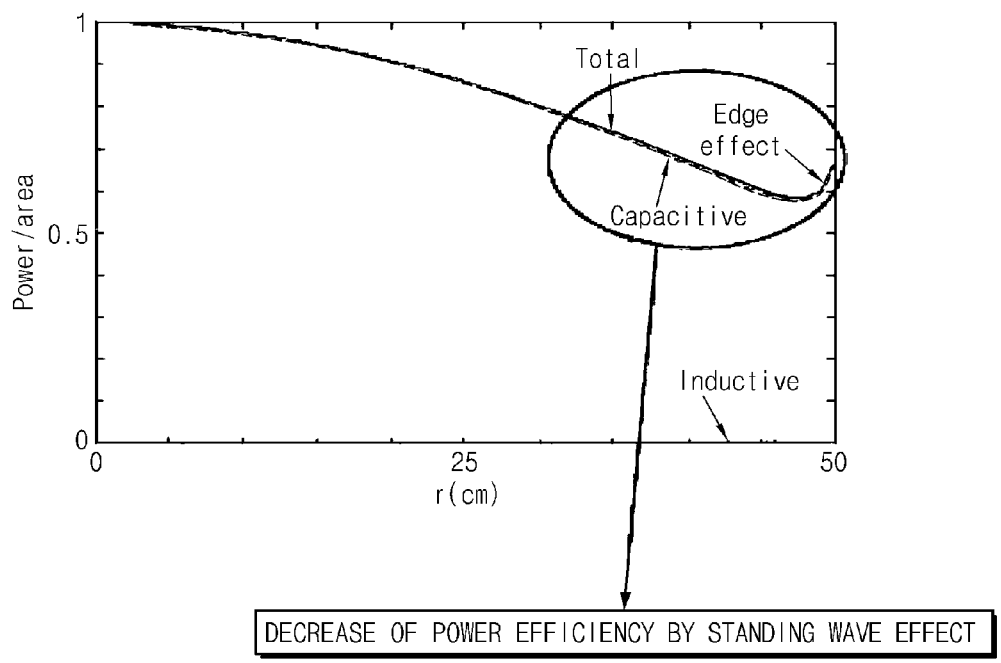
FIG. 2 is a diagram for describing the standing wave effect.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 3:
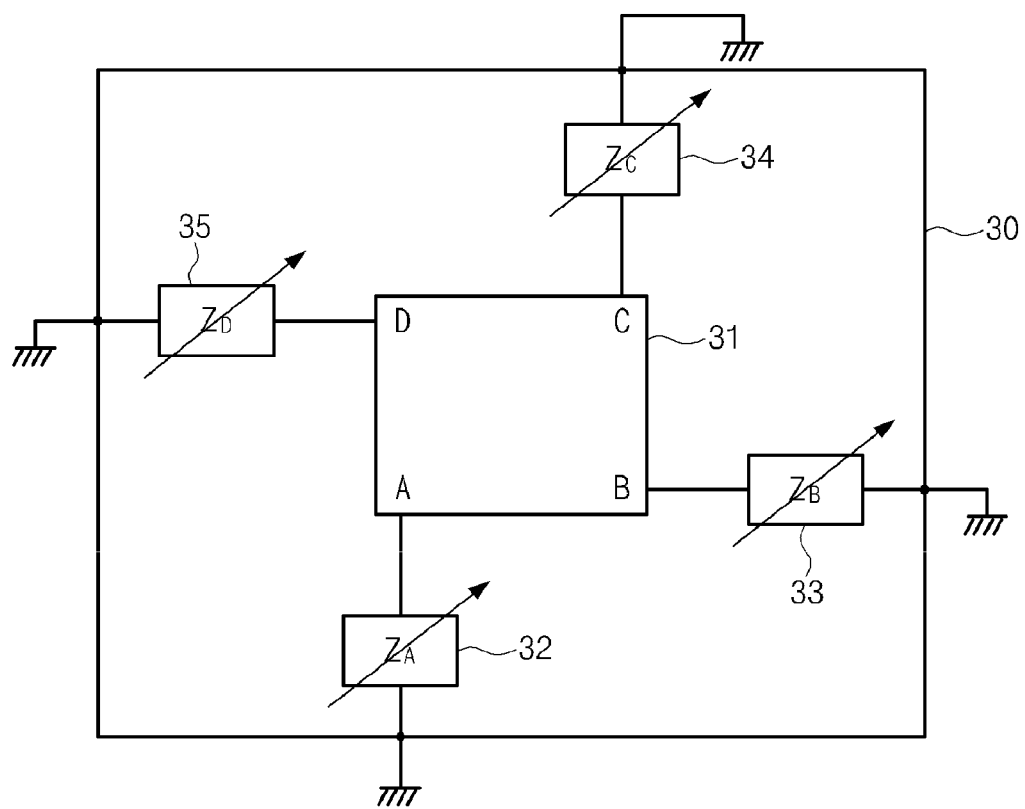
FIG. 3 is a diagram illustrating a plasma source according to an embodiment of the present invention.

FIG. 3 is a diagram illustrating a plasma source according to an embodiment of the present invention. FIGS. 5 to 8 are diagrams illustrating an example of an impedance box according to an embodiment of the present invention.

Referring to FIG. 3 and FIGS. 5 to 8, the plasma source includes a source electrode 31 and impedance boxes 32, 33

34, and 35. The source electrode 31 generates plasma based on capacitive coupling between the source electrode 31 and an ElectroStatic Chuck (ESC) (not shown). The impedance boxes 32, 33 34, and 35 are connected at one end to an outer circumference surface of the source electrode 31 and are grounded at the other end to a vacuum chamber 30. The source electrode 31 is a plate shape antenna, and is positioned inside the vacuum chamber 30 or at a top of the vacuum chamber 30 as illustrated in FIG. 1. However, according to an embodiment of the present invention, it is also possible to apply a Reaction Ion Etching (RIE) scheme in which the source electrode 31 is positioned below the vacuum chamber 30 and, in another embodiment, the source electrodes 31 may be positioned at all of a top and bottom of the vacuum chamber 30.

According to an aspect, an electric current applied by an external source RF (not shown) flows through the source electrode 31 and the impedance boxes 32, 33, 34, and 35, and the impedances of the respective impedance boxes 32, 33, 34, and 35 are separately controllable. By doing so, potential differences among edge portions (A, B, C, and D) of the source electrode 31 connecting with the respective impedance boxes 32, 33, 34, and 35 can be equally controlled. Accordingly, the non-uniformity of a density of plasma caused by the standing wave effect may be dealt with.

Here, the standing wave effect refers to a phenomenon in which an increase of a size of the antenna 31 results in a decrease of an efficiency of an RF power delivered to an outer side rather than a center of the antenna 31, thus leading to a decrease of a density of plasma generated at the outer side of the antenna 31 [Ref. 1 XXVIIth Eindhonen, the Netherlands, 18-22 Jul. 2005, Plasma Processing in the 21$^{st}$ Century, M. A. Lieberman]. Accordingly, by controlling each of the impedances of the impedance boxes 32, 33, 34, and 35 connecting to the outer circumference surface of the source electrode 31, the standing wave effect may be reduced.

Figure 5:
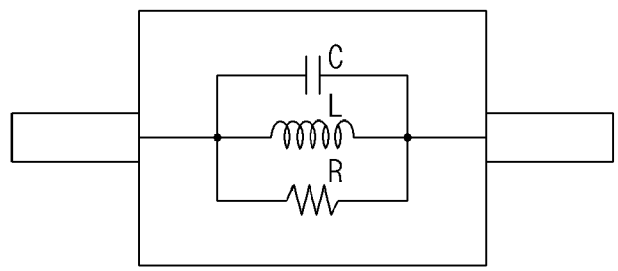
FIG. 5 is a schematic diagram illustrating that impedance boxes of FIGS. 3 and 4 are parallel resonance circuits.
Figure 6:
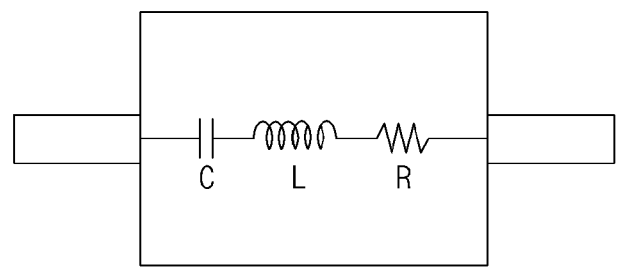
FIG. 6 is a schematic diagram illustrating that impedance boxes of FIGS. 3 and 4 are serial resonance circuits.
Figure 7:
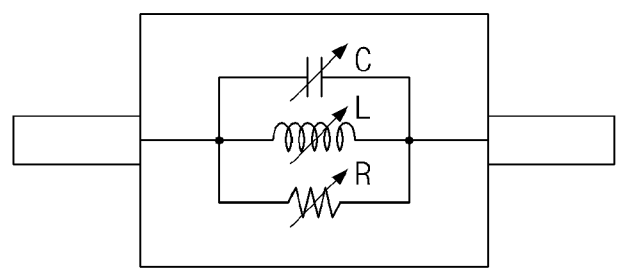
FIG. 7 is a schematic diagram illustrating that impedance boxes of FIGS. 3 and 4 are parallel variable resonance circuits.
Figure 8:
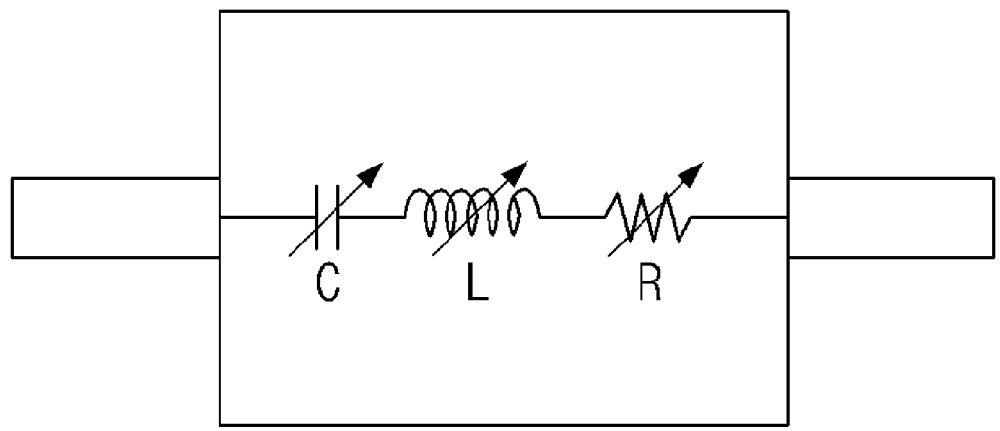
FIG. 8 is a schematic diagram illustrating that impedance boxes of FIGS. 3 and 4 are serial variable resonance circuits.

Each of the impedance boxes 32, 33, 34, and 35 can be comprised of any one of a parallel resonance circuit of FIG. 5, a serial resonance circuit of FIG. 6, a parallel variable resonance circuit of FIG. 7, and a serial variable resonance circuit of FIG. 8.

Figure 4:
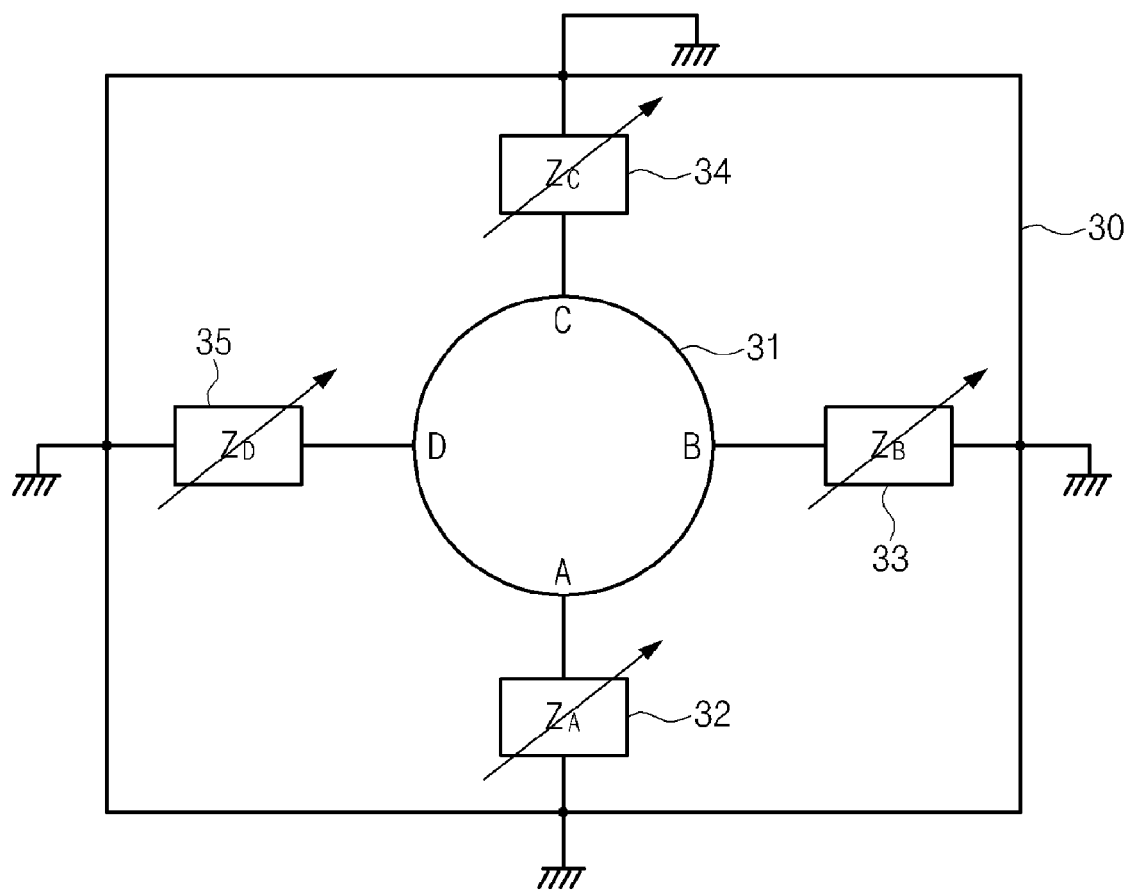
FIG. 4 is a diagram illustrating a plasma source according to another embodiment of the present invention.

FIG. 4 is a diagram illustrating a plasma source according to another embodiment of the present invention.

Referring to FIG. 4, similar to FIG. 3, the plasma source can include a source electrode 31 and a plurality of impedance boxes 32, 33, 34, and 35 connecting to an outer circumference surface of the source electrode 31, excepting that the source electrode 31 is of a disk shape. FIGS. 3 and 4 illustrate that the impedance boxes are four in number, but this number does not intend to limit the scope of the present invention and may be determined according to need of those skilled in the art.

As described above, the non-uniformity of a density of plasma caused by the standing wave effect generated according to large sizing of a substrate, can be solved by installing a plurality of impedance boxes for current control at an outer circumference surface of a source electrode, which is a plate shape antenna, such that the plurality of impedance boxes are grounded to a vacuum chamber, and separately controlling the impedances of the respective impedance boxes.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A plasma source comprising:
   a source electrode receiving a source Radio Frequency (RF) from the external and generating plasma based on capacitive coupling within a vacuum chamber; and
   an impedance box connecting at one end to an outer circumference surface of the source electrode, grounded at the other end to the vacuum chamber, and controlling an electric current flowing from the source electrode to the vacuum chamber by the source RF.

2. The plasma source of claim 1, wherein the source electrode is of a disk shape or rectangular shape.

3. The plasma source of claim 2, wherein the impedance box is comprised of a plurality of impedance boxes, and
   wherein each of the impedances of the plurality of impedance boxes is separately controlled to equally control potential differences among edge portions of the source electrode connecting with the plurality of impedance boxes.

4. The plasma source of claim 3, wherein the impedance box is any one of a parallel resonance circuit, a serial resonance circuit, a parallel variable resonance circuit, and a serial variable resonance circuit.

5. The plasma source of claim 1, wherein the source electrode is positioned at a top or bottom of the vacuum chamber.

6. The plasma source of claim 1, wherein the source electrode is positioned at all of a top and bottom of the vacuum chamber.

* * * * *